United States Patent [19]

Murphy et al.

[11] Patent Number: 5,227,046

[45] Date of Patent: Jul. 13, 1993

[54] LOW TEMPERATURE TIN-BISMUTH ELECTROPLATING SYSTEM

[75] Inventors: Timothy I. Murphy, Mahtomedi; Brian R. Reynolds, Brooklyn Center, both of Minn.

[73] Assignee: Unisys Corporation, Blue Bell, Pa.

[21] Appl. No.: 772,513

[22] Filed: Oct. 7, 1991

[51] Int. Cl.⁵ ................................................ C25D 3/60
[52] U.S. Cl. .................................... 205/252; 205/253; 205/254; 204/DIG. 13
[58] Field of Search .............. 205/238, 252, 253, 254, 205/920, 148, 161; 204/DIG. 13

[56] References Cited

U.S. PATENT DOCUMENTS 3,360,446  12/1967  Jongkind ............................ 205/252
4,518,465   5/1985  Morimoto et al. ................. 205/920
5,039,576   8/1991  Wilson ................................ 205/254

FOREIGN PATENT DOCUMENTS 0110928  9/1978  Japan .
9004048  4/1990  PCT Int'l Appl. .

Primary Examiner—John Niebling
Assistant Examiner—Brian M. Bolam
Attorney, Agent, or Firm—LeRoy D. Maunu; Charles A. Johnson; Mark T. Starr

[57] ABSTRACT

A system for electroplating a tin-bismuth alloy at near eutectic composition is disclosed. The system includes the plating bath and the process for initially preparing the bath as well as the process for plating an object with tin-bismuth alloy. The system further includes an apparatus for regulating the concentrations of tin and bismuth in the plating bath and the process by which the concentrations are controlled.

12 Claims, 8 Drawing Sheets

LOW TEMPERATURE TIN-BISMUTH ELECTROPLATING SYSTEM

BACKGROUND OF THE INVENTION

A. Field of the Invention

This invention involves an electroplating bath and an electroplating process, along with a process for preparing the bath and a process and apparatus for regulating the metal content of the bath. More particularly, it involves processes for preparing, regulating and depositing a near eutectic tin-bismuth alloy. The invention also relates to the bath used for implementation of the electroplating process and the apparatus used for regulating the relative concentrations of tin and bismuth ions in the bath.

B. Description of the Prior Art

The electrodeposition of tin and various tin alloys is well known as a means to produce a solderable coating on printed circuit boards used for the interconnection of electronic components.

The complexity of printed circuit boards has evolved in response to the striking escalation in chip density. To achieve the required level of complexity, the feature sizes on printed circuit boards have been reduced to near 4 mils while the number of 0.006 inch (6 mils) thick inner-layers has increased to as many as 50. This means that the thickness of high technology circuit boards now approach 0.03 inches (0.300 mils). The finished copper plated hole size on these boards approaches 0.015 inches. Therefore, the board thickness to hole diameter ratio, or aspect ratio, is now near 20:1.

High aspect ratio printed circuit boards cause a number of unique problems in connection with the selection and uniform deposition of a solderable coating.

First, the copper within the high aspect holes can be damaged if the reflow soldering temperature is too high. This damage results from the mismatch in thermal expansion between the copper in the plated through hole, (PTH), and the insulating glass reinforced plastic materials of the printed circuit board.

The melting point of normal tin lead solder is 183° C. and processing temperatures are typically between 220°–250° C. Processing boards within this temperature range can excessively strain the copper in the PTH. The z-axis expansion, because it is not tempered by glass reinforcement, can result in stress and deflection of the copper plating causing the copper barrel to break.

Second, the higher the temperature at which the soldering process takes place, the longer the time the process takes. This is due to the fact that during the soldering process the entire printed circuit board must be heated to the process temperature. For small printed circuit boards this extra time is not significant. However, large, multilayer printed circuit boards have significant mass which must be heated to the process temperature and the time involved can unreasonably slow processing and permit oxidation and intermetallic growth.

Finally, the solderable coating must have good throwing power in order to effectively and uniformly plate the high aspect ratio holes associated with very thick printed circuit boards. The throwing power of a plating bath is a measure of its ability to uniformly plate the interior surface of a hole. Poor throwing power results in inadequate plating of the interior of holes which ultimately results in defective printed circuit boards or high board failure rates.

Solderable coatings of tin or tin alloys currently used are not effective in solving the soldering and process problems associated with plating thick multilayer printed circuit boards. It is well known that the addition of small amounts of bismuth to tin or tin alloy is advantageous in inhibiting "tin pest" and in reducing the formation of "tin whiskers". Tin pest is a condition whereby the metallic properties of tin are degraded at low temperatures. A loose tin power is formed which separates from the base metal thereby exposing the underlying metal to the effects of corrosion. Tin whiskers is a descriptive name given to the formation of whiskers of tin which develop on the surface of the deposit and can cause electrical shorts and related problems. See, for example, U.S. Pat. No. 3,663,384 to Lescure, U.S. Pat. No. 4,162,205 to Wilson, U.S. Pat. No. 4,252,618 to Grenda, U.S. Pat. No. 4,331,518 to Wilson and U.S. Pat. No. 4,565,610 to Nobel et. al. These patents all disclose the use of very small amounts of bismuth in the solderable coating, the concentration of which is significantly less than the concentration of tin. These patents do not teach or suggest the use of a significant concentration of bismuth to obtain a solderable coating with a low melting temperature and high throwing power. For example, U.S. Pat. Nos. 4,331,518 and 4,162,205, both to Wilson, disclose plating processes resulting in from 0.15% to 0.80% by weight of bismuth in the electroplate. U.S. Pat. No. 4,252,618 to Grenda discloses the presence of from 0.08% to 1.1% by weight of bismuth in the alloy. These levels are used to solve the problems resulting from, tin pest and tin whiskering, but do not result in any improvement of solderability, or appreciable reduction of melting temperature.

In order to solve the soldering and process problems discussed above it is necessary to provide a plating bath and plating process with high throwing power capable of depositing a solderable coating with a melting point less than presently used with tin-lead solders. It is known that the deposition of a eutectic tin-bismuth allow consisting of 43% by weight tin and 57% by weight bismuth will result in a solderable coating with a lower melting point. However, no commercially feasible tin-bismuth plating baths or plating processes exist which consistently produce a uniform deposit of tin-bismuth alloy at near eutectic composition both on the surface of the printed circuit board and in the interior of high aspect ratio holes. Therefore, a need exists to provide an electroplating bath, method for regulating the bath and method for plating which may be regulated in a manner that allows the plating process to be commercially feasible.

OBJECTS OF THE INVENTION

It is a primary object of this invention to provide an improved soldering process utilizing eutectic, or near eutectic, tin-bismuth alloy.

It is an object of this invention to provide an improved electroplating bath for use in electroplating a tin-bismuth alloy at or near its eutectic composition.

It is a further object of this invention to provide an improved process for electroplating a tin-bismuth alloy at or near its eutectic composition.

A further object of this invention to provide an improved electroplating bath and process for electroplating a tin-bismuth solderable coating with a reflow melting point of not more than about 160° C.

It is yet another object of this invention to provide an improved electroplating bath with high throwing power for plating a solderable coating of tin-bismuth on thick, multilayer printed circuit boards with high aspect ratio holes.

It is another object of this invention to provide an improved process for preparing an electroplating bath containing tin and bismuth for use in plating a tin-bismuth alloy at or near its eutectic composition.

It is still a further object of this invention to provide an improved process and apparatus for regulating the relative concentrations of tin and bismuth in an electroplating bath.

SUMMARY OF THE INVENTION

This invention solves the problems discussed above in regards to solderable coatings for use on thick, multilayer printed circuit boards with high aspect ratio holes. It involves an electroplating bath and process for plating a tin-bismuth alloy at near eutectic composition. It also involves the process of preparing the bath and the process and apparatus for regulating the relative concentrations of tin and bismuth in the bath.

The plating bath and process of this invention results in the plating of a solderable alkaline etch resistant coating of near eutectic tin-bismuth alloy which has a reflow melting point less than 160° C. The high throwing power of the bath and the low melting point of the tin-bismuth alloy make it particularly advantageous for use as a solderable coating on thick, multilayer printed circuit boards with high aspect ratio holes.

DETAILED DESCRIPTION OF THE INVENTION

The present invention involves the plating of a solderable coating of tin-bismuth alloy at near eutectic ratios on the object to be plated. A eutectic tin-bismuth alloy has a metal concentration of about 43% tin and 57% bismuth by weight. "Near eutectic" tin-bismuth alloy as used herein means that the alloy has a concentration of tin from about 33% to 53% by weight. Deposits within that composition range will have a melting point temperature of 160° C. or less.

Figure 1:
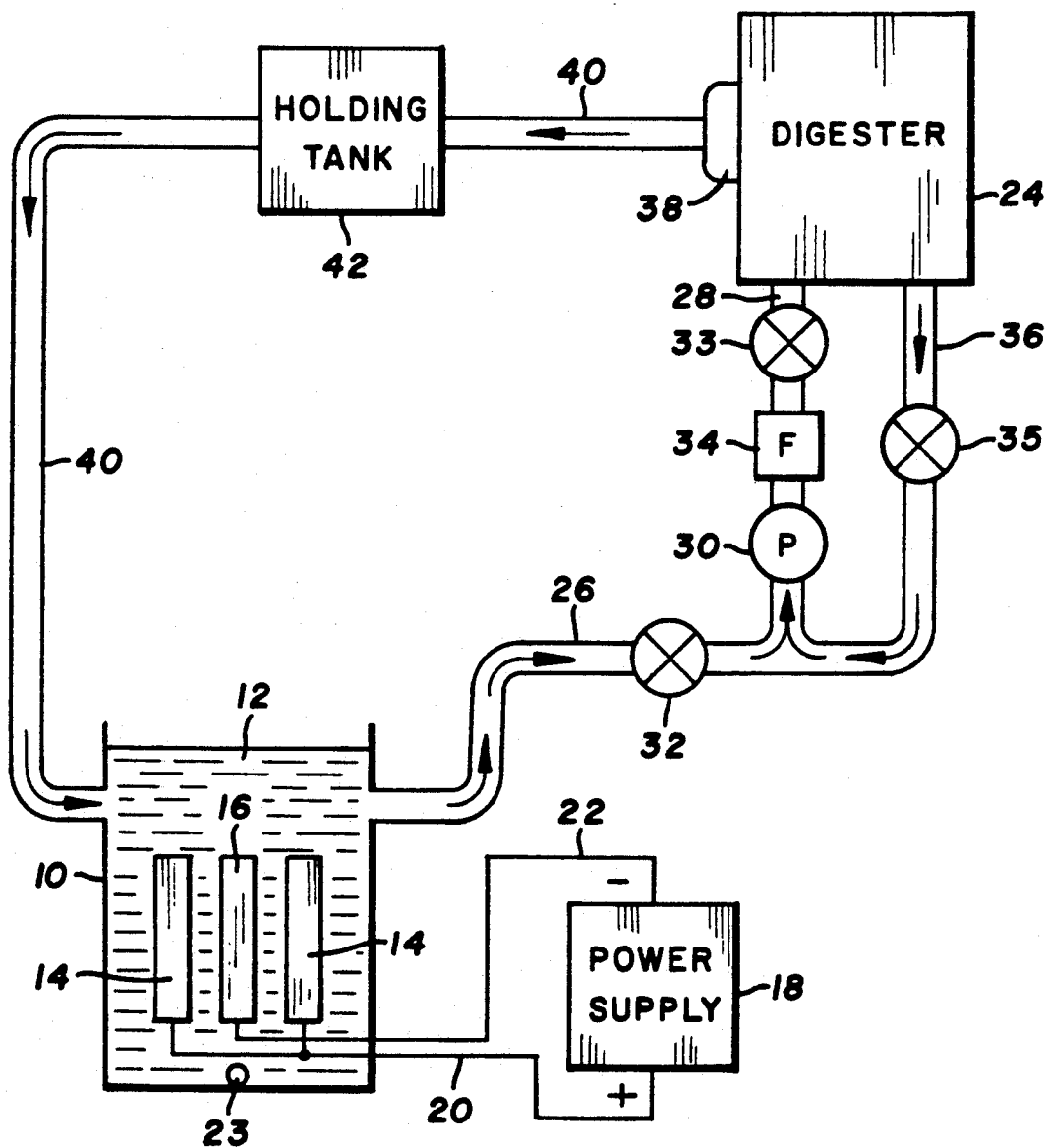
FIG. 1 is a simplified diagram of the plating system.

FIG. 1 is an overall system diagram of the plating system of the present invention. A plating tank 10 contains a tin-bismuth electrolyte plating bath 12, the preparation and composition of which will be described in more detail hereafter. Immersed in plating bath 12 is a least one anode 14. In the preferred embodiment there are ten bismuth anodes 14, five uniformly distributed along each side of a substrate 16 which is the object to be plated. Bismuth anodes 14 and substrate 16 are supported in plating tank 10 by structure not shown or necessary for an understanding of the present invention. The anodes 14 are connected to a power supply 18 by leads 20. The substrate 16 is connected as a cathode to power supply 18 by leads 22. A perforated tube 23 runs along the bottom of plating tank 10 directly under the object to be plated 16. Nitrogen gas from a source not shown is introduced into tube 23 to agitate plating bath 12 in order to increase plating efficiency in a manner which will be described in more detail later.

During the plating process the plating bath 12 becomes depleted of tin and enriched with bismuth. In order to control the metal concentration of plating bath 12 a digester 24 is utilized. Plating bath 12 is pumped into digester 24 through plating bath outlet pipe 26 and digester inlet pipe 28 by pump 30. The flow of plating bath 12 is regulated by valve 32, 33 and 35. Valves 32, 33 and 35 may be adjusted so that electrolyte is pumped only from plating tank 10 or only from digester 24 or from a combination of both sources. Filter 34 is included in pipe 28 to clean the plating bath. Digester 24 is equipped with a discharge pipe 36. When valve 32 is closed a circulation loop is provided through discharge pipe 36 and inlet pipe 28. This loop provides a means of circulation and filtration of the electrolyte which is necessary to the effective operation of the digester. Digester 24 is provided with a level overflow 38. Level overflow 38 is connected to plating tank 10 by return pipe 40 and allows electrolyte to be returned directly from digester 24 to plating tank 10. Optionally, a holding tank 42 may be used to contain and further filter the electrolyte until it is transferred to plating tank 10. The specific structure and operation of digester 24 will be discussed in more detail with regards to FIG. 2.

The plating process is conducted in a conventional manner. The object 16 to be plated, such as a printed circuit board, is immersed into the plating bath 12 where it is connected as a cathode. As mentioned previously, in the preferred embodiment, there are multiple anodes 14 uniformly distributed about the object to be plated. This increases plating uniformity and alloy distribution and allows effective plating of thick, multilayer printed circuit boards with high aspect ratio holes. At a cathode current density of between about 4 to 8 amps per square foot a typical plating cycle produces 0.3 to 0.5 mils of alloy in 11 to 15 minutes. A higher current density produces a deposit with a higher bismuth content. A lower current density produces a deposit with a higher tin content.

In order to plate tin-bismuth alloy at near eutectic ratios the bath must contain a significant concentration of bismuth ions and a lower concentration of stannous ion because tin will plate out preferentially to bismuth.

To plate a eutectic alloy there must be about four to six times as many bismuth ions as stannous ions in the bath.

A multilayer printed circuit board for a sophisticated main frame computer may attain a thickness up to about 300 mils such that the aspect ratio of board thickness to hole diameter of the plated through holes may be 20 to 1 or more by the time the board is to be plated with a solderable etch resistant coating. In order to effectively plate the center of such high aspect ratio holes a high throwing power is necessary. The plating bath and process of this invention has the necessary throwing power.

High throwing power is obtained by keeping the total metal concentration of tin and bismuth in the bath below about 16 grams per liter and the methane sulfonic acid content near 200 grams per liter. At or near that total metal content a surface to hole plating ratio near 2:1 can be achieved for 20:1 aspect ratio holes. This means that the plating thickness on the surface of the board is twice that at the center of the hole. The bath, having this total metal concentration at the stannous ion to bismuth ion ratios stated above, will have stannous ions in the range of about 1.8 to 2.4 grams per liter as tin and bismuth ions in the range of about 7 to 14 grams per liter as bismuth. Wetting agents are included in the bath to reduce gas pitting and provide continuous fine grained deposits. These may consist of Ultrastan Primary and Ultrastan Activator which are commercially available products of Atochem N.A. and which are typically present together at concentrations below 8% by volume.

Tin-bismuth has been deposited at near eutectic ratios on printed circuit boards using a methane sulfonic electrolyte with the following composition:
  130-200 grams per liter Methane sulfonic acid (MSA)
  2 grams per liter Stannous Tin (Sn++) from Stannous Methane Sulfonate
  11 grams per liter Bismuth methane sulfonate
  2-5% by volume Ultrastan 100 Primary
  1.5-3% by volume Ultrastan 100 Activator The bath with the above composition can be obtained by mixing the required amounts of the various constituents together. However, because bismuth salts are difficult to obtain commercially in sufficient quantities, the bath can be produced from reagent stannous methane sulfonate and methane sulfonic acid using the following bath start-up process which may be performed in the plating tank or in a separate tank. In the plating system illustrated in FIG. 1 the start-up process is performed in plating tank 10.

Sufficient quantities of a tin sulfonate salt such as stannous methane sulfonate (Sn++) and methane sulfonic acid should be added to water to obtain a Sn++ tin content of about 13 grams to 15 grams per liter and an acid content of about 180 grams per liter. A suitable substrate made of a conductive material such as copper is connected as a cathode and bismuth anodes should be loaded into the plating tank.

Sufficient current is then applied in order to reduce the tin content and increase the bismuth content of the bath. The current loading should be near 5.3 amps/liter. The typical current densities at the anode and cathode should be below about 7 and 5 amps per square feet, respectively.

This process causes tin to be plated out on the substrate (cathode) and bismuth to be dissolved into the electrolyte from the anodes. Bismuth will also plate out on the substrate, slowly at first and then increasingly as the amount of bismuth in the bath increases. After approximately 24 hours to 28 hours this process will result in a bath with the concentrations as set forth above. Once proper bath concentration has been achieved, eutectic deposits can be produced.

It is common in electroplating processes to include some means for continually stirring or circulating the electrolyte. Two means of agitation have been found to be effective for plating tin-bismuth alloy in high aspect ratio holes. First, the board itself is agitated back and forth by its supporting structure in a direction normal to the holes. Agitation of the board creates a sufficient flow of electrolyte through the plated through holes in the board to support proper reaction rates. Agitation of the board alone, however, is not sufficient particularly if there are stagnant areas on the surface of the board. Such stagnant areas will become more rapidly depleted of tin and are more prone to bismuth rich deposition. To counteract that phenomenon, a second type of agitation of the electrolyte is required. Conventional methods often use air sparging where air is introduced into the bath at selected locations and allowed to bubble to the surface thus agitating the electrolyte. The use of air in this acid tin alloy bath is not recommended due to the oxidation reaction of tin from its +2 valance to the less desirable +4 valence state. This problem is overcome by the use of an inert gas such as nitrogen as the sparging gas. During the plating process the bath is agitated by injecting nitrogen gas into a perforated tube running across the bottom of the tank immediately below the object being plated at a rate of about 1 cubic foot per hour for every 3 gallons of electrolyte. This combination of board agitation and nitrogen gas sparging has been found to be particularly effective in promoting plating uniformity both on the surface of the board and in plated through holes.

During the plating process the total concentration of bismuth in the bath continues to rise. This rise can be explained as follows. Tin and bismuth are deposited from the +2 and +3 valance states respectively. Eutectic tin-bismuth alloy has an atomic ratio near Sn3 Bi2. This means that for every 4 bismuth atoms dissolved from the anode, 2 bismuth atoms and 3 tin atoms are deposited at the cathode.

Since pure bismuth anodes are used, this reaction results in a gradual increase in bismuth concentration and a steady decline in tin ion concentration in the same manner as discussed above in connection with preparation of the bath. The rate of rise in bismuth ion concentration and corresponding increase in the Bi/Sn ionic ratio is accelerated by the plating inefficiency exhibited by the low metal content, high throwing power alloy bath. Consequently, with shifting Bi/Sn ratios the eutectic deposit composition can only be achieved for limited periods of time. To compensate for this process drift, the bath can be intermittently bailed and additional tin salts and methane sulfonic acid added to replace the bailed volume in order to bring the Bi/Sn ratio back into the desired range. Although this method is effective, it is wasteful in that both chemical and waste treatment costs are increased. Therefore, a less wasteful method of regulating the bath is desirable.

Figure 2:
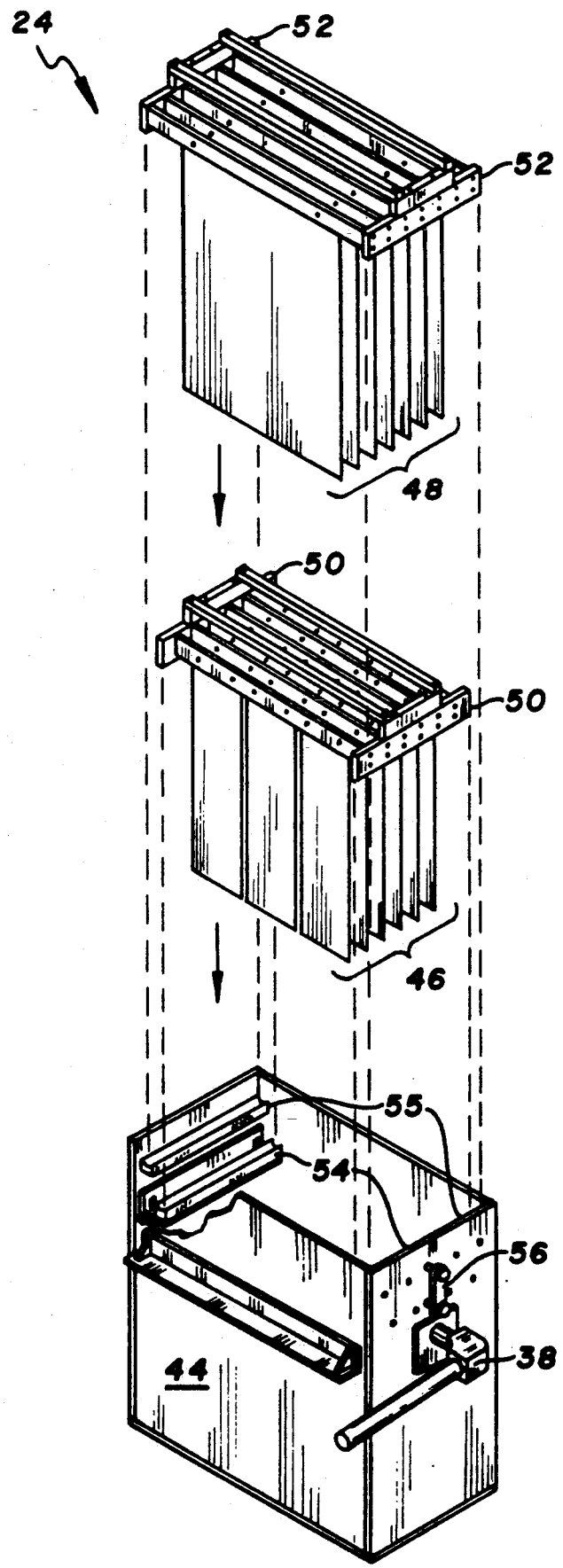
FIG. 2 is a perspective view of the digester used to regulate the metal content of the bath which has been partially exploded to show the interrelationship of the tin and stainless steel electrodes.

This invention provides an apparatus which allows the metal content of the bath to be adjusted appropriately using a tin digestion process. With reference to FIG. 2 digester 24 is shown in perspective and is partially exploded to show the interrelationship of its parts. Digester 24 is used to adjust the concentrations of bismuth and tin in the bath. Digester 24 is comprised of a tank 44 into which is placed a plurality of tin electrodes 46 interleaved between a of plurality of counter electrodes 48. Counter electrodes 48 may be made of any electrically conductive material. In the preferred embodiment counter electrodes 48 are made of stainless steel. In the preferred embodiment tin electrodes 46 consist of six parallel planar sections with each section having three rectangular electrodes. The counter electrodes 48 consist of seven parallel rectangular planar electrodes. Although this shape, number and configuration for the electrodes 46 and 48 have been found to be particularly advantageous, other shapes, numbers and configurations could be used.

Tin electrodes 46 and counter electrodes 48 are held in place by mounting supports 50 and 52, respectively. Support brackets 54 and 55 are mounted on each side of tank 44 and mate with mounting supports 50 and 52, respectively to support the electrodes in proper position in tank 44. Support brackets 54 and 55 are electrically connected together with a shorting strap 56. This provides an electrical path which connects tin electrodes 46 and counter electrodes 48. Level overflow 38 is connected to tank 44 and allows excess electrolyte to drain from tank 44 if the level rises too high.

In operation, either simultaneously or after the plating process has been completed, the bismuth enriched electrolyte is transferred into tank 44. The electrochemical difference between tin and bismuth in acid solutions causes bismuth ions to be reduced to metal and tin electrodes 46 to be oxidized or taken into solution as ions. The rate at which this reaction takes place within digester 24 is controlled by the total surface area of the electrodes and by the spacing between tin electrodes 46 and counter electrodes 48. An increase in the surface area or decrease in the spacing will cause an increase in the rate of the reaction. The rate of this reaction is high at first but gradually slows due to a build up of bismuth on the tin electrode. Therefore, it is advantageous to slow this build up as much as possible. Counter electrodes 48 are provided to slow this build up. They are electrically connected to tin electrodes 46 to provide an alternate electrical path. The bismuth metal continues to plate on tin electrodes 46, but at a somewhat diminished rate since a substantial amount of bismuth plates on the counter electrodes 48. The agitation provided by circuiting the electrolyte around the circulation loop formed by discharge pipe 36 and inlet pipe 28 (FIG. 1) drives the reaction towards the counter electrodes. This further slows the build up of bismuth on tin electrodes 46. Digester 24 is run until the concentration of tin and bismuth in the bath are at the appropriate levels. During operation the level of electrolyte is caused to rise above the level overflow 38. This enables the electrolyte to bleed off and be returned to plating tank 10.

This invention is additionally illustrated by the following Examples which are to be considered illustrative of the present invention. It should be understood, however, that the invention is not limited to the specific details of the Examples.

Figure 3:
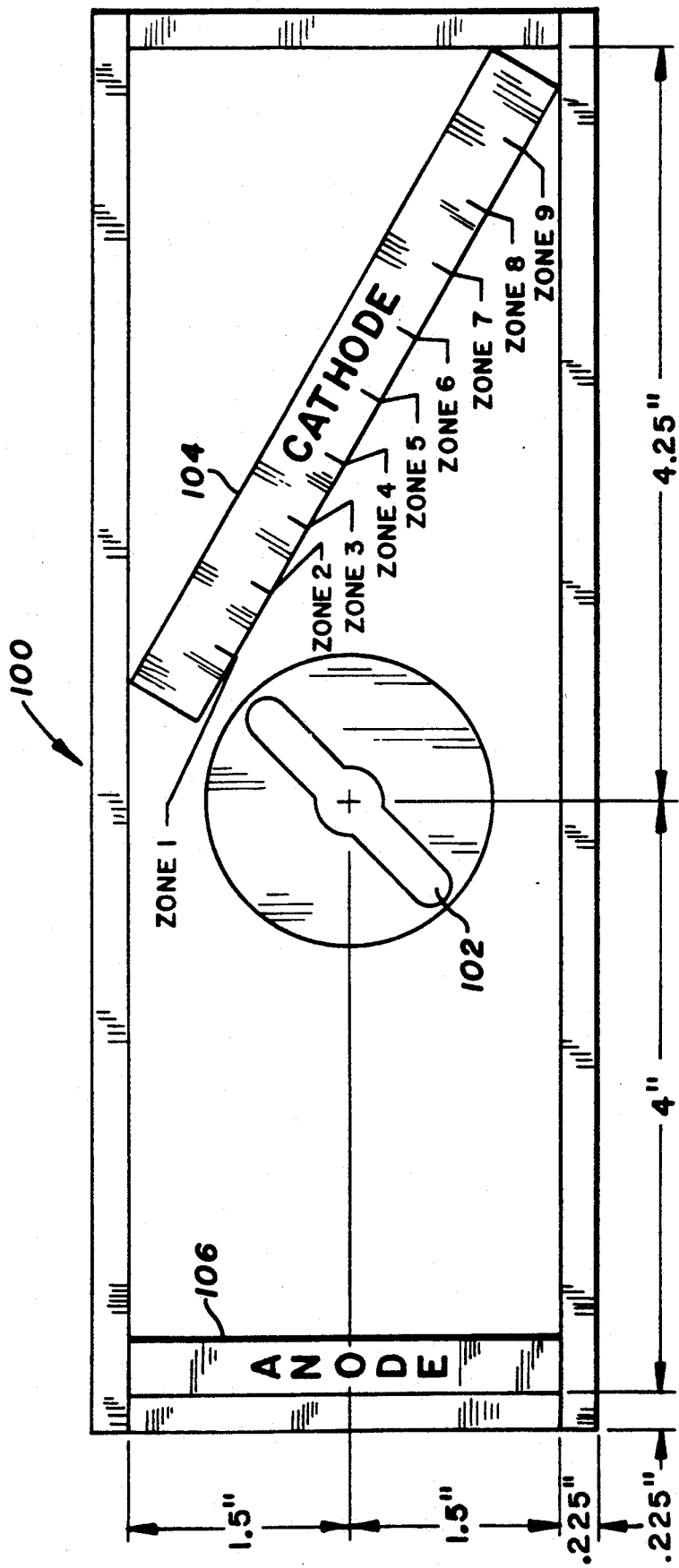
FIG. 3 is a top view of the Hull cell utilization in the plating examples showing the location of the stir bar and plating zones.

Examples 1 through 27 show the effect of various changes in chemical parameters upon the quality and composition of alloy deposits. The plating data and results for these examples are set forth in FIGS. 4 through 12 and will be discussed in more detail hereafter. These plating examples were accomplished using a standard one liter Hull cell as illustrated in FIG. 3. The Hull cell 100 is equipped with a magnetic stir bar 102 located along the longitudinal center line of the Hull cell 100 a total of 4 inches from the anode end. Plating tests were carried out at one amp using 5 inch wide ¼ inch thick double sided copper laminate panels 104 as the cathode. The anode 106 consists of pure bismuth. In order to illustrate the effect of current density upon the deposit characteristic the test panels 104 were measured using x-ray fluorescence at nine sites or zones across the center line of immersion depth of the panel, each test zone being located ½ inch from the next.

In addition to setting forth Hull cell plating data, examples 24 through 27 also represent the results of plating tests which were run concurrently on large printed circuit boards and were performed in a 90 gallon plating tank. The boards were held in the plating bath between two copper plated stainless steel racks. In Examples 24 and 25 the boards had no drilled holes and were 16.25 inches × 29 inches. In Examples 26 and 27 the boards were 30 inches × 32 inches by 0.285 inch thick and had approximately 80,000 drilled holes.

Tables 1A and 1B is a chart setting forth the data and results of Examples 1 through 8 which were run using bath samples withdrawn at different intervals during a typical bath start-up process as previously described.

TABLE 1A

| STATIC PLATING VARIABLE Bi/SN RATIO | | | | |
|---|---|---|---|---|
| | 1 | 2 | 3 | 4 |
| Sn+2 | 10.2 | 8.9 | 3.4 | 2.5 |
| Bi+3 | 0.13 | 1.87 | 8.57 | 10.4 |
| Sn TOTAL | 12.7 | 11 | 5.4 | 4.03 |
| MSA | 188 | 188 | 192 | 191 |
| Bi/Sn | 0.0127 | 0.2101 | 2.5205 | 4.16 |
| AGGITATION YES/NO | NO | NO | NO | NO |
| PLATING TIME (MINUTES) | 15 | 15 | 15 | 15 |
| CUMULATIVE AMP HOURS (BATH START-UP) | 0 | 371 | 1880 | 2326 |
| HULL CELL ZONE (THICKNESS) | | | | |
| 1 | 163 | 203 | 188 | 173 |
| 2 | 188 | 265 | 229 | 212 |
| 3 | 248 | 341 | 277 | 286 |
| 4 | 329 | 329 | 262 | 271 |
| 5 | 220 | 233 | 184 | 203 |
| 6 | 190 | 210 | 139 | 170 |
| 7 | 192 | 194 | 125 | 129 |
| 8 | 190 | 180 | 120 | 120 |
| 9 | 181 | 173 | 112 | 117 |
| ZONE (% TIN CONTENT) | | | | |
| 1 | 96 | 83 | 44 | 39 |
| 2 | 97 | 83 | 43 | 36 |
| 3 | 97 | 85 | 43 | 35 |
| 4 | 97 | 87 | 46 | 38 |
| 5 | 96 | 86 | 50 | 41 |
| 6 | 96 | 87 | 51 | 42 |
| 7 | 96 | 87 | 53 | 44 |
| 8 | 96 | 87 | 54 | 47 |
| 9 | 96 | 87 | 56 | 48 |
| AVERAGE THICKNESS | 211.2 | 236.4 | 181.8 | 186.8 |
| AVERAGE TIN | 96.3 | 85.8 | 48.9 | 41.1 |

TABLE 1B

| EFFECTIVE OF AGITATION AND Bi/SN RATIO | | | | |
|---|---|---|---|---|
| | 5 | 6 | 7 | 8 |
| Sn+2 | 10.2 | 8.9 | 3.4 | 2.5 |
| Bi+3 | 0.13 | 1.87 | 8.57 | 10.4 |
| Sn TOTAL | 12.7 | 11 | 5.4 | 4.03 |
| MSA | 188 | 188 | 192 | 191 |

TABLE 1B-continued
EFFECTIVE OF AGITATION AND Bi/SN RATIO

|  | 5 | 6 | 7 | 8 |
|---|---|---|---|---|
| Bi/Sn | 0.0127 | 0.2101 | 2.5205 | 4.16 |
| AGGITATION YES/NO | YES | YES | YES | YES |
| PLATING TIME (MINUTES) | 15 | 15 | 15 | 15 |
| CUMULATIVE AMP HOURS (BATH START-UP) | 0 | 371 | 1880 | 2326 |
| HULL CELL ZONE (THICKNESS) | | | | |
| 1 | 744 | 688 | 419 | 310 |
| 2 | 606 | 575 | 374 | 337 |
| 3 | 530 | 640 | 354 | 352 |
| 4 | 442 | 507 | 349 | 311 |
| 5 | 393 | 387 | 309 | 253 |
| 6 | 325 | 313 | 268 | 202 |
| 7 | 234 | 250 | 219 | 187 |
| 8 | 183 | 208 | 178 | 166 |
| 9 | 152 | 168 | 163 | 124 |
| ZONE (% TIN CONTENT) | | | | |
| 1 | 96 | 90 | 44 | 36 |
| 2 | 96 | 91 | 50 | 40 |
| 3 | 96 | 93 | 65 | 50 |
| 4 | 96 | 93 | 77 | 60 |
| 5 | 96 | 93 | 82 | 66 |
| 6 | 96 | 94 | 85 | 70 |
| 7 | 95 | 93 | 86 | 77 |
| 8 | 95 | 93 | 86 | 80 |
| 9 | 94 | 92 | 87 | 78 |
| AVERAGE THICKNESS | 401.0 | 415.1 | 292.6 | 249.1 |
| AVERAGE TIN | 95.6 | 92.4 | 73.6 | 61.9 |

The bath concentration of Example 1 represents the concentration as it would be in a freshly made up bath prior to initiating the bath start-up process. Examples 2, 3 and 4 represent the bath concentrations which exist during the bath start-up process at 371, 1880 and 2326 and amp hours respectively. Examples 5 through 8 were withdrawn at the same time as Examples 1 through 4, the only difference being that the Hull cell was agitated by rotating the stir bar at 800 rpm during each 15 minute test. Comparison of the plating results between Examples 1 and 5, Examples 2 and 6, Examples 3 and 7, and Examples 4 and 8 show the strong influence that stirring, or local agitation has upon deposit composition and plating thickness. The effect of agitation becomes more pronounced as amp hours increase and the bismuth to tin ratio increases. These Examples provide support for the use of agitation such as by nitrogen sparging to improve plating uniformity.

Figure 4:
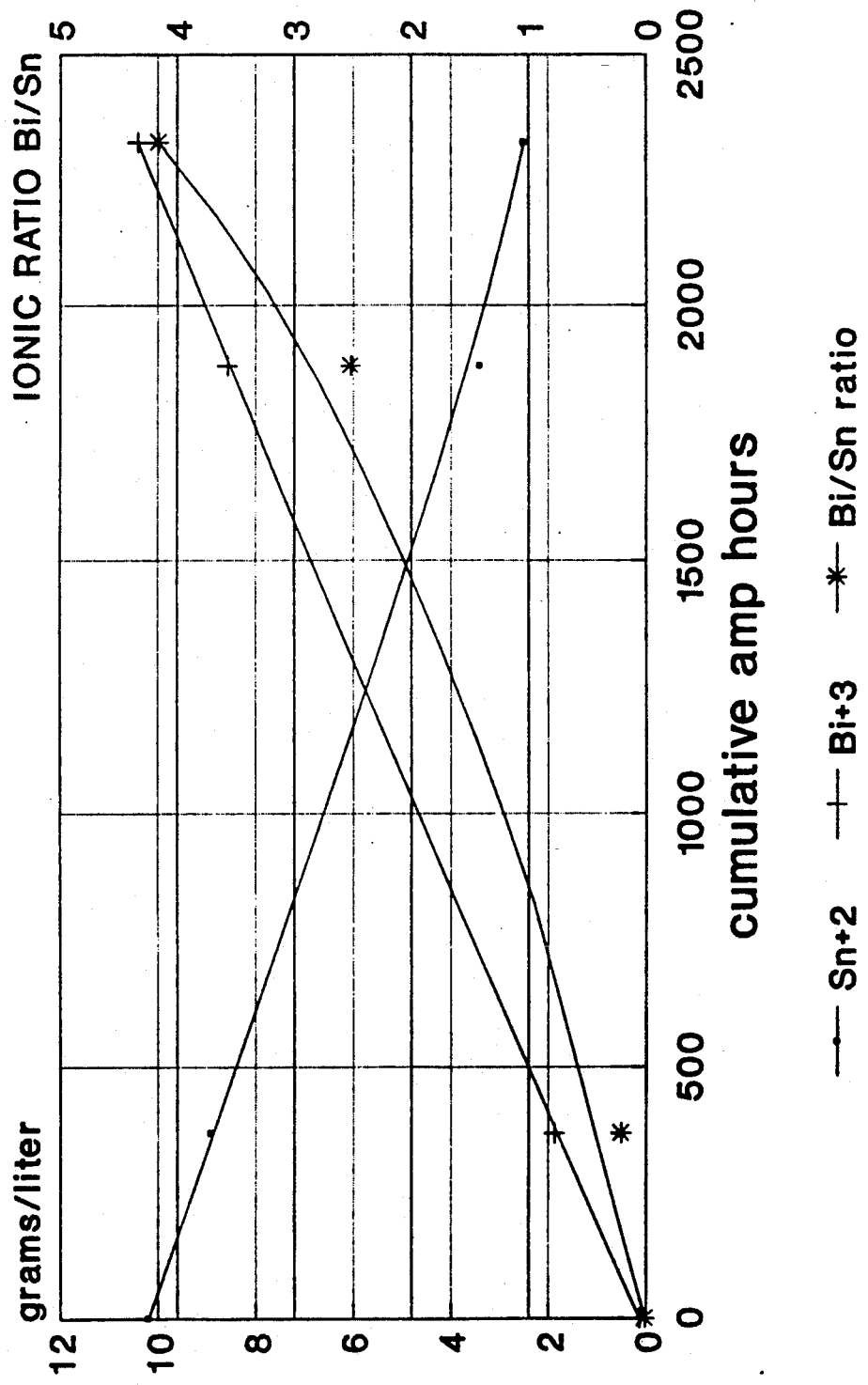
FIG. 4 is a graph which plots the change in concentrations of Sn+2, Bi+3, and Bi/Sn at different intervals during a typical bath start-up process.

FIG. 4 is a graph which plots the change in the concentrations of the stannous +2 ion (Sn+2), and the bismuth +3 ion (Bi+3) and the bismuth to tin ratio (Bi/Sn) at different intervals during the bath start-up process. FIG. 4 demonstrates the effectiveness of the bath start-up process in decreasing the tin concentration while increasing the bismuth concentration and the bismuth to tin ratio.

The data and results of Examples 9 through 12 are set forth in chart form in Tables 2A and 2B.

TABLE 2A
CHANGE ACID AT SAME METAL RATIO SAME TIN CONTENT

|  | 9 | 10 | 11 | 12 |
|---|---|---|---|---|
| Sn+2 | 1.68 | 1.72 | 1.77 | 2.02 |
| Bi+3 | 10.19 | 10.48 | 10.18 | 10.19 |
| Sn TOTAL | 2.99 | 3.01 | 2.95 | 3.44 |
| MSA | 106 | 169 | 240 | 317 |
| Bi/Sn | 6.0654 | 6.0930 | 5.7514 | 5.0445 |
| AGGITATION YES/NO | YES | YES | YES | YES |
| PLATING TIME (MINUTES) | 15 | 15 | 15 | 15 |
| CUMULATIVE AMP HOURS (BATH START-UP) | N/A | N/A | N/A | N/A |
| HULL CELL ZONE (THICKNESS) | | | | |
| 1 | 451 | 397 | 397 | 201 |
| 2 | 426 | 337 | 389 | 251 |
| 3 | 482 | 402 | 417 | 279 |
| 4 | 441 | 386 | 356 | 306 |
| 5 | 362 | 324 | 299 | 234 |
| 6 | 308 | 279 | 247 | 174 |
| 7 | 252 | 241 | 201 | 128 |
| 8 | 199 | 201 | 197 | 96 |
| 9 | 169 | 194 | 154 | 43 |
| ZONE (% TIN CONTENT) | | | | |
| 1 | 53 | 44 | 47 | 6 |
| 2 | 69 | 54 | 61 | 5 |
| 3 | 81 | 72 | 73 | 4 |
| 4 | 85 | 79 | 76 | 4 |
| 5 | 86 | 82 | 78 | 6 |
| 6 | 87 | 83 | 79 | 8 |
| 7 | 88 | 85 | 80 | 10 |
| 8 | 87 | 85 | 81 | 14 |
| 9 | 87 | 87 | 82 | 55 |
| AVERAGE THICKNESS | 343.3 | 306.8 | 295.2 | 190.2 |
| AVERAGE TIN | 80.3 | 74.6 | 73.0 | 12.4 |

TABLE 2B
TOTAL METAL ION SAME Sn/Bi + MSA

|  | 13 | 14 | 15 |
|---|---|---|---|
| Sn+2 |  | 1.91 | 1.61 | 239 |
| Bi+3 |  | 9.84 | 8.16 | 12.28 |
| Sn TOTAL |  | 3.14 | 2.67 | 3.45 |
| MSA |  | 169 | 165 | 173 |
| Bi/Sn |  | 5.1518 | 5.0683 | 5.1380 |
| AGGITATION YES/NO | YES | YES | YES |
| PLATING TIME (MINUTES) | 15 | 15 | 15 |
| CUMULATIVE AMP HOURS (BATH START-UP) | N/A | N/A | N/A |
| HULL CELL ZONE (THICKNESS) | | | |
| 1 |  | 453 | 388 | 446 |
| 2 |  | 423 | 369 | 500 |
| 3 |  | 515 | 424 | 459 |
| 4 |  | 453 | 377 | 370 |
| 5 |  | 377 | 320 | 337 |
| 6 |  | 325 | 271 | 392 |
| 7 |  | 276 | 233 | 257 |
| 8 |  | 221 | 201 | 205 |
| 9 |  | 210 | 193 | 167 |
| ZONE (% TIN CONTENT) | | | |
| 1 |  | 48 | 45 | 62 |
| 2 |  | 62 | 59 | 77 |
| 3 |  | 78 | 74 | 83 |
| 4 |  | 82 | 79 | 84 |
| 5 |  | 84 | 82 | 87 |
| 6 |  | 86 | 84 | 87 |
| 7 |  | 87 | 85 | 88 |
| 8 |  | 88 | 87 | 88 |
| 9 |  | 89 | 88 | 87 |
| AVERAGE |  | 361.4 | 308.4 | 348.1 |

TABLE 2B-continued

| TOTAL METAL ION SAME Sn/Bi + MSA | | | |
|---|---|---|---|
| | 13 | 14 | 15 |
| THICKNESS | | | |
| AVERAGE TIN | 78.2 | 75.9 | 82.6 |

These Examples illustrate the effect of varying the concentration of methane sulfonic acid while maintaining a relatively constant tin concentration (Sn+2) and relatively constant bismuth to tin ionic ratio (Bi/Sn).

Figure 5:
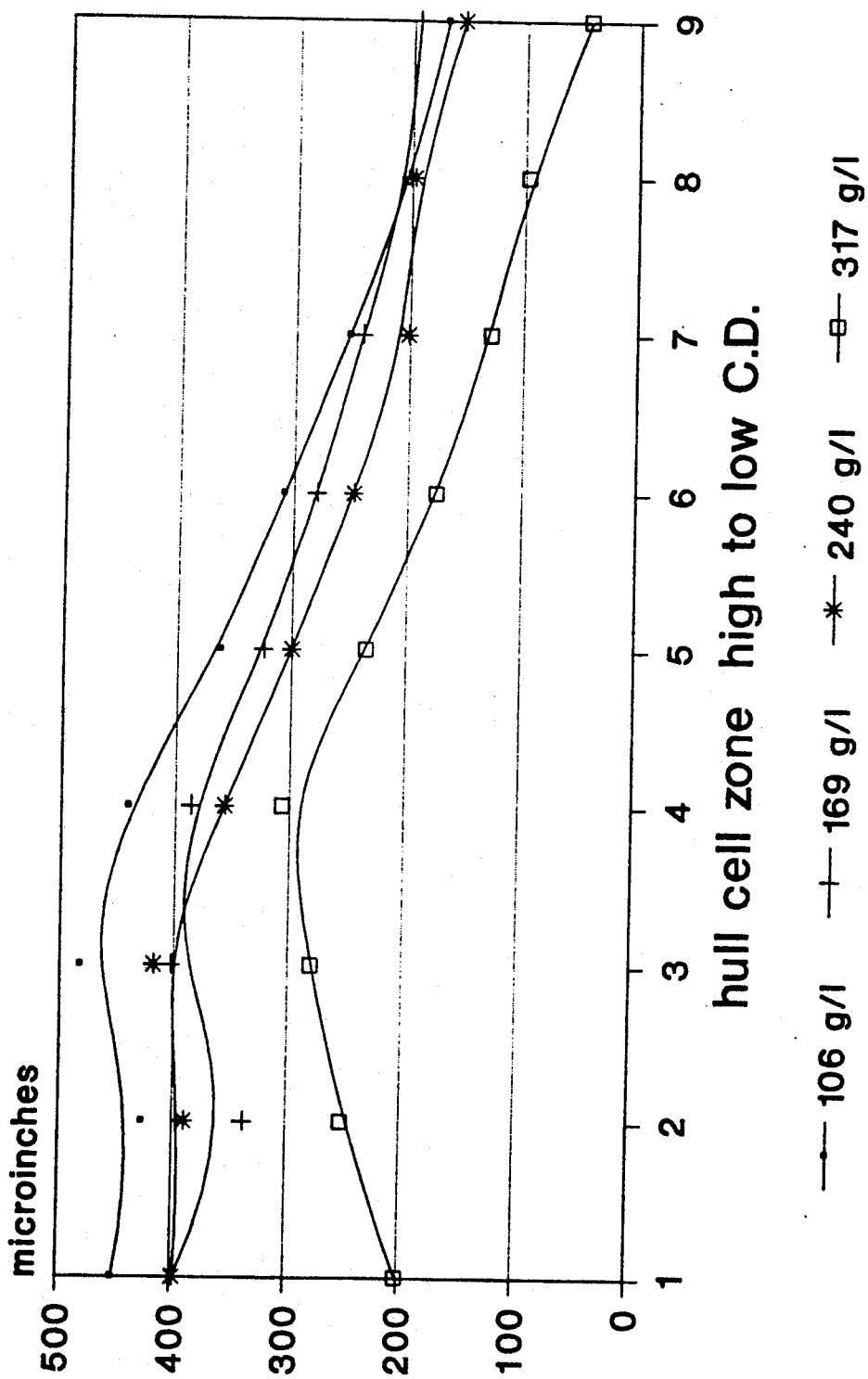
FIG. 5 is a graph showing the influence of methane sulfonic acid concentration on plating thickness in diffent Hull cell zones for Examples 9 through 12.
Figure 6:
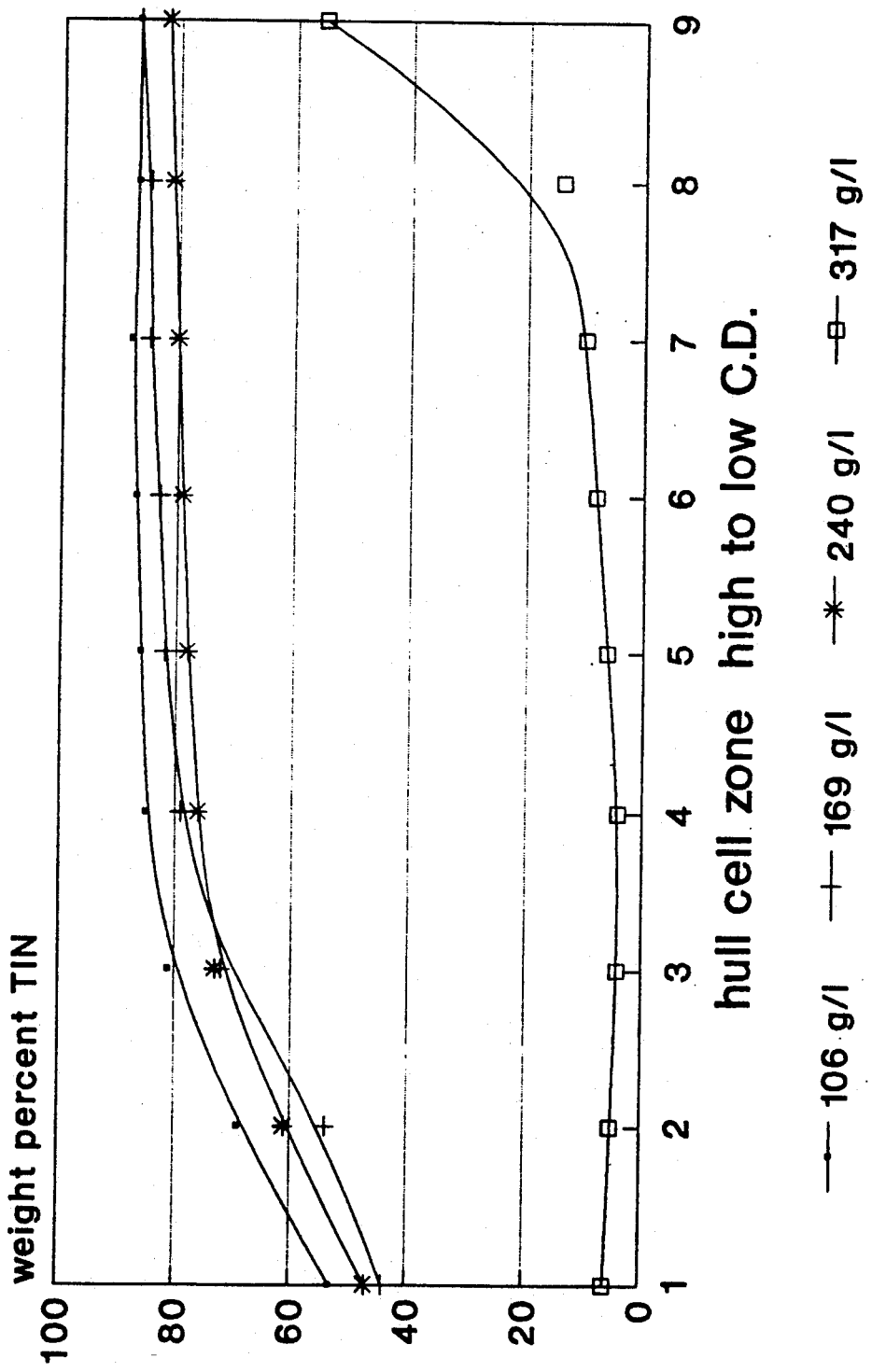
FIG. 6 is a graph showing the effect of variations in the concentration of methane sulfonic acid on the total percentage of tin in the deposits in different Hull cell zones for Examples 9 through 12.

The results of Examples 9 through 12 are plotted in FIGS. 5 and 6. FIG. 5 is a graph showing the effect of methane sulfonic acid concentration in the bath on plating thickness. FIG. 6 is a graph showing the effect of variations in the concentration of methane sulfonic acid on the total percentage of tin in the deposit. These figures show that both the plating efficiency (plating thickness) and the tin content of the deposit drastically decline at methane sulfonic acid levels above about 240 grams per liter. Satisfactory plating performance can be achieved at levels between about 106 grams per liter and 240 grams per liter methane sulfonic acid. Based upon these Examples the preferred plating range is between about 130 and 200 grams per liter methane sulfonic acid.

Figure 7:
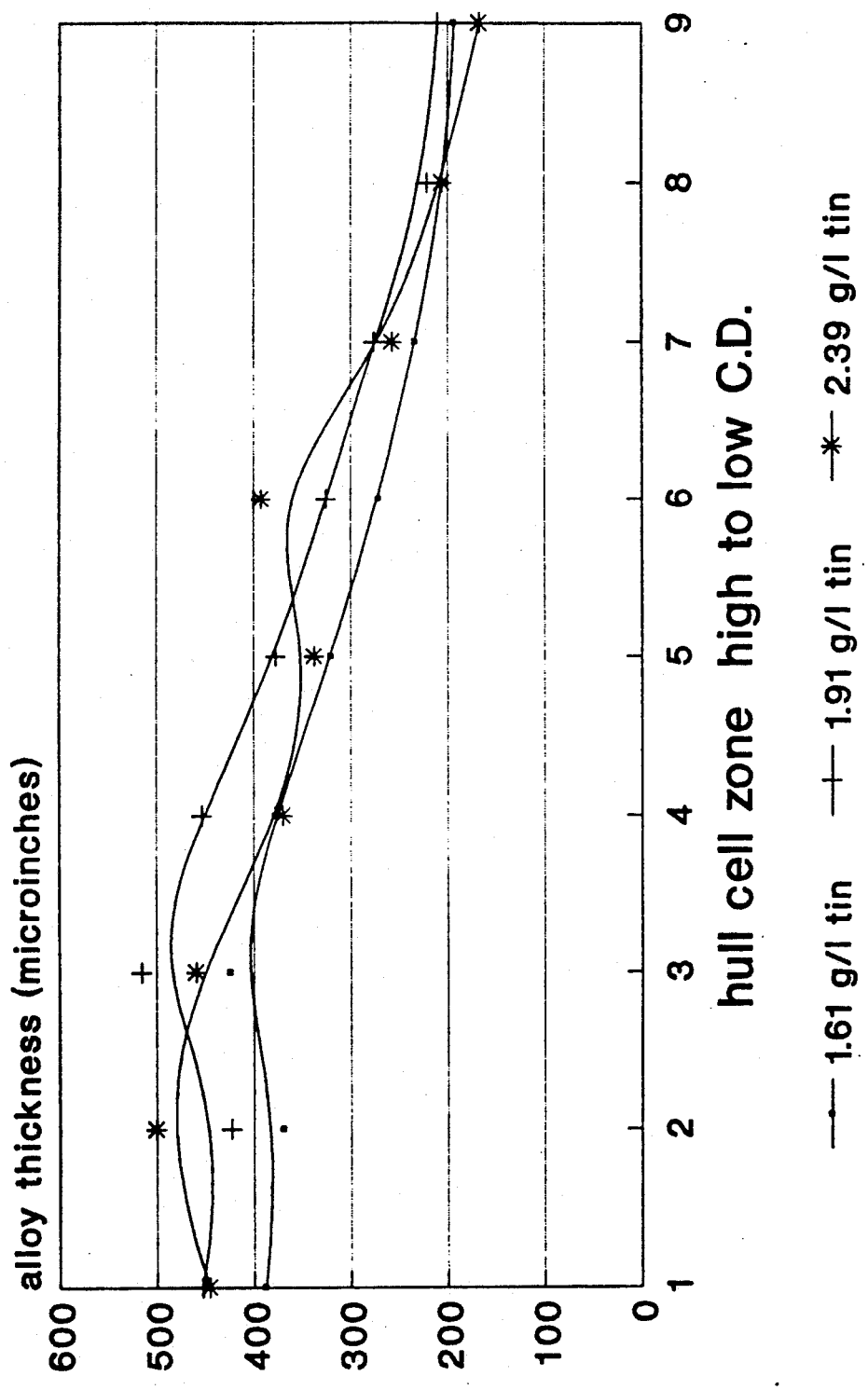
FIG. 7 is a graph representing the effect of variations of tin ion concentration on plating efficiency (thickness) in the deposits of Examples 13 through 18 at a Bi/Sn ratio of approximately 5 to 1.
Figure 8:
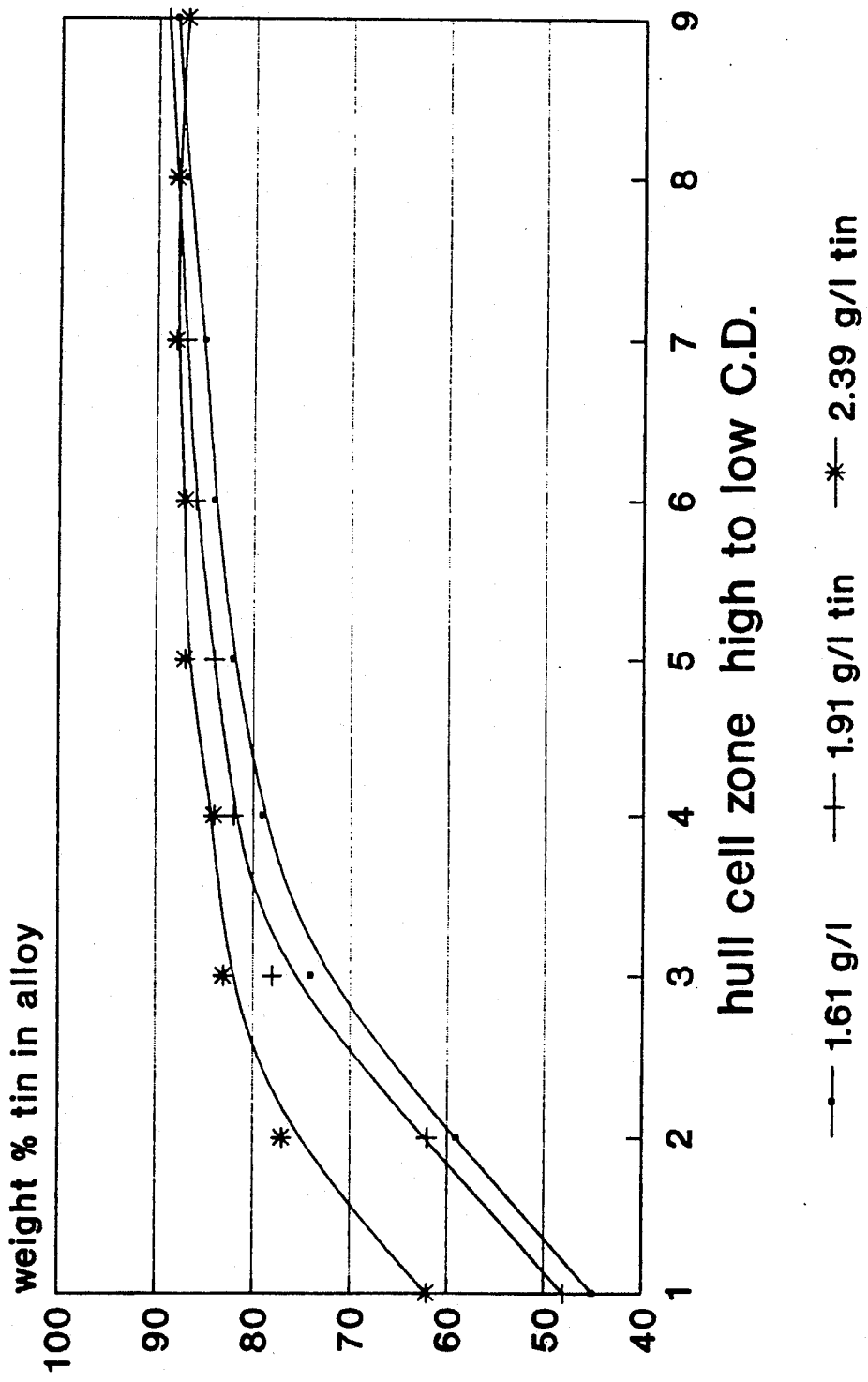
FIG. 8 is a graph showing the effect of variations of tin ion concentration on the percentage of tin in the deposits of Examples 13 through 15 at a Bi/Sn ratio of approximately 5 to 1.

Examples 13, 14 and 15 are also set forth in Tables 2A and 2B. These examples show the effect upon the deposit of variations in the concentration of stannous ions while maintaining a relatively constant Bi/Sn ratio. The results of these examples are plotted in FIGS. 7 and 8. FIG. 7 is a graph representing the effect of variations in tin ion concentration on plating efficiency. FIG. 8 is a graph representing the effect of variations of tin ion concentration on the percentage of tin in the deposit. The results indicate that bath stability is improved without the loss of eutectic plating capability at a tin concentration near 2 grams per liter.

Examples 16 and 17 are set forth in the chart of Tables 3A and 3B.

TABLE 3A

| HIGH METALS CONTENT | | |
|---|---|---|
| | 16 | 17 |
| EXAMPLES BATH COMPOSITION | | |
| Sn+2 g/l | 3.22 | 8.9 |
| Bi+3 g/l | 30.91 | 59.21 |
| Sn TOTAL g/l | 4.96 | 10.4 |
| MSA g/l | 161 | 154 |
| Bi/Sn ionic ratio | 9.60 | 6.65 |
| PLATING TIME (MINUTES) | 15 | 15 |
| AGGITATION OR NITROGEN FLOW | YES | YES |
| HULL CELL ZONE (microinches) | | |
| 1 | 598 | 505 |
| 2 | 533 | 345 |
| 3 | 583 | 261 |
| 4 | 534 | 204 |
| 5 | 409 | 151 |
| 6 | 349 | 113 |
| 7 | 279 | 74 |
| 8 | 200 | 52 |
| 9 | 162 | 45 |
| ZONE % TIN | | |
| 1 | 65 | 3 |
| 2 | 76 | 4 |
| 3 | 84 | 5 |
| 4 | 86 | 6 |
| 5 | 87 | 9 |
| 6 | 88 | 12 |

TABLE 3A-continued

| HIGH METALS CONTENT | | |
|---|---|---|
| | 16 | 17 |
| 7 | 88 | 18 |
| 8 | 87 | 31 |
| 9 | 86 | 50 |
| AVERAGE THICKNESS | 405.2 | 194.4 |
| AVERAGE TIN | 83.0 | 15.3 |

TABLE 3B

| PLATE DOWN AFTER DOSE WITH TIN | | | | | | |
|---|---|---|---|---|---|---|
| | 18 | 19 | 20 | 21 | 22 | 23 |
| Sn+2 g/L | 4.25 | 3.67 | 3.13 | 2.68 | 2.28 | 1.95 |
| Bi+3 g/L | 12.84 | 13.35 | 13.82 | 14.30 | 14.74 | 15.17 |
| Sn TOTAL g/L | 6.46 | 5.88 | 5.34 | 4.89 | 4.49 | 4.16 |
| MSA g/L | 198 | 198 | 198 | 198 | 198 | 198 |
| Bi/Sn ionic ratio | 3.02 | 3.64 | 4.42 | 5.34 | 6.47 | 7.76 |
| PLATING TIME (MINUTES) | 15 | 15 | 15 | 15 | 15 | 15 |
| AGGITATION OR NITROGEN FLOW | YES | YES | YES | YES | YES | YES |
| HULL CELL ZONE (microinches) | | | | | | |
| 1 | 582 | 539 | 458 | 430 | 398 | 373 |
| 2 | 521 | 491 | 433 | 387 | 356 | 316 |
| 3 | 643 | 616 | 494 | 442 | 360 | 337 |
| 4 | 580 | 529 | 456 | 431 | 360 | 344 |
| 5 | 423 | 423 | 370 | 362 | 316 | 297 |
| 6 | 339 | 352 | 323 | 322 | 287 | 242 |
| 7 | 273 | 293 | 263 | 263 | 244 | 209 |
| 8 | 222 | 230 | 212 | 211 | 188 | 185 |
| 9 | 191 | 193 | 182 | 195 | 181 | 169 |
| ZONE % TIN | | | | | | |
| 1 | 71 | 60 | 52 | 41 | 33 | 25 |
| 2 | 80 | 73 | 67 | 54 | 44 | 33 |
| 3 | 86 | 82 | 80 | 72 | 61 | 54 |
| 4 | 88 | 86 | 84 | 80 | 74 | 69 |
| 5 | 89 | 87 | 86 | 83 | 78 | 74 |
| 6 | 89 | 88 | 87 | 85 | 82 | 76 |
| 7 | 90 | 88 | 87 | 86 | 83 | 79 |
| 8 | 90 | 88 | 88 | 86 | 84 | 81 |
| 9 | 90 | 88 | 88 | 87 | 86 | 83 |
| AVERAGE THICKNESS | 419.3 | 407.3 | 354.6 | 338.1 | 298.9 | 274.7 |
| AVERAGE TIN | 85.9 | 82.2 | 79.9 | 74.9 | 69.4 | 63.8 |

These examples show the results of plating carried out with a bath having a high total metal concentration. The results indicate that at higher total bismuth concentrations it is not possible to plate a eutectic alloy even though the relative concentration of tin is adjusted accordingly. These examples indicate that the ability to plate a eutectic alloy does not depend solely upon the bismuth to tin ionic ratio but is also dependent upon the total metal content of the bath.

In examples 18 through 23, also set forth in Tables 3A and 3B, a plating solution with initial concentrations as set forth in example 18 was used. This bath had a relatively high tin concentration (4.25 grams per liter) and a low bismuth to tin ionic ratio (3.02). Successive 15 minute plating tests were run in the Hull cell with this bath and the changes in bath content are reflected in examples 19 through 23. These examples show how the bismuth concentration is increased with increasing Bi/Sn ratio during successive plating procedures on an unadjusted process window. The need to adjust the bath concentration in order to extend the process window is illustrated clearly.

The results of Examples 24 through 27 are set forth in chart form in Table 4.

TABLE 4

LARGE PANEL AND BOARD PLATING

| EXAMPLES | 24 | 25 | 26 | 27 |
|---|---|---|---|---|
| BATH COMPOSITION | | | | |
| $Sn^{+2}$ g/L | 1.82 | 2.06 | 1.75 | 1.97 |
| $Bi^{+3}$ g/L | 10.61 | 9.01 | 9.65 | 10.97 |
| Sn TOTAL g/L | 6.24 | 6.28 | 2.88 | 4.56 |
| MSA g/L | 146 | 146 | 173 | 165 |
| Bi/Sn ionic ratio | 5.61 | 4.37 | 5.51 | 5.57 |
| PLATING TIME (MINUTES) | 12 | 12 | 15 | 15 |
| PART A - HULL CELL TESTS | | | | |
| AGGITATION OR NITROGEN FLOW | 30 cfh | 30 cfh | 30 cfh | 30 cfh |
| HULL CELL ZONE (microinches) | | | | |
| 1 | 385 | 404 | 362 | 409 |
| 2 | 331 | 374 | 330 | 368 |
| 3 | 381 | 440 | 378 | 399 |
| 4 | 370 | 413 | 360 | 413 |
| 5 | 308 | 339 | 300 | 348 |
| 6 | 275 | 306 | 262 | 308 |
| 7 | 235 | 252 | 215 | 257 |
| 8 | 193 | 204 | 174 | 206 |
| 9 | 169 | 179 | 150 | 185 |
| ZONE (% TIN CONTENT) | | | | |
| 1 | 37 | 44 | 40 | 43 |
| 2 | 45 | 58 | 55 | 54 |
| 3 | 67 | 75 | 75 | 73 |
| 4 | 76 | 80 | 82 | 81 |
| 5 | 80 | 82 | 84 | 84 |
| 6 | 83 | 84 | 86 | 86 |
| 7 | 84 | 85 | 87 | 87 |
| 8 | 84 | 85 | 87 | 88 |
| 9 | 85 | 84 | 87 | 88 |
| AVERAGE THICKNESS | 294.1 | 323.4 | 281.2 | 321.4 |
| AVERAGE TIN | 71.2 | 75.2 | 76.1 | 76.0 |
| PART B - BOARD PLATING RESULTS | | | | |
| DEPOSIT % TIN | 43 ± 4 | 49 ± 5 | 45 ± 3 | 50 ± 8 |
| THICKNESS uiN | 202 ± 1 | 218 ± 1 | 369 ± 5 | 502 ± 57 |
| HOLE ASPECT RATIO | N/A | N/A | 20:1 | 20:1 |
| SURF/HOLE PATIO RATIO | | | 1.72:1 | 2.16:1 |
| Amps/ft2 | 11.37 | 11.37 | 10.35 | 10.35 |

Table 4 consists of two parts representing two sets of tests run with the same bath composition. Table 4 Part A sets forth the results of Hull cell tests run with the compositions set forth. Table 4 Part B sets forth the results of plating tests performed in the plating tanks on printed circuit boards. The results of the Hull cell tests on Part A are included for the purpose of comparison with the earlier Examples.

In Examples 24 and 25 of Table 4, Part B a 16¼ inch×29 inch double sided copper panel having no holes was plated. After the panel was plated in the bath of Example 24 the bath was run through the digester of this invention for a period of about 25 minutes resulting in the bath composition used for Example 25. The change in the bath composition shows the effectiveness of the digester in decreasing the bismuth concentration and the Bi/Sn ratio while increasing the tin concentration in the bath. The plating results of the panel shows that as the tin content in the bath increases the percentage of tin in the alloy deposited also increases.

Examples 26 and 27 of FIG. 12, Part B, represent plating examples utilizing a large multilayer printed circuit board with in excess of 80,000 drilled holes. These Examples illustrate that a higher tin content in the bath at the same bismuth to tin ionic ratio results in increases in both plating thickness (efficiency) and tin concentration in the deposit, but with a slightly reduced throwing power as represented by the increase in the surface to hole plating ratio.

The principals, embodiments, modes of operation and examples have been set forth as an unrestricted illustration of the invention. It is of course understood that various changes will become apparent to those skilled in the art without departing from the spirit and scope of the invention.

We claim:

1. An aqueous electroplating bath for electroplating tin-bismuth alloy at near eutectic composition comprising:
   methane sulfonic acid in an amount equal to between about one hundred thirty to two hundred grams per liter;
   stannous ions and bismuth ions in predetermined amounts such that the total predetermined metal concentration is below about sixteen grams per liter and the amount by weight of bismuth ions is between about four to six times the amount by weight of stannous ions; and
   wetting agents in amounts by weight sufficient to reduce gas pitting and provide continuous fine grained deposits.

2. An aqueous electroplating bath as in claim 1 wherein said predetermined amount of said stannous ions is equal to between about one and eight tenths to two and four tenth grams per liter and said predetermined amount of said bismuth ions is equal to between about seven to fourteen grams per liter as bismuth.

3. A method for preparing an aqueous electroplating bath the process being performed in a tank containing a predetermined amount of water and utilizing an external electrical power source, the process comprising the steps of:
   dissolving about one hundred eighty grams per liter of methane sulfonic acid in the water;
   dissolving about five and three tenths grams per liter of tin sulfonate in the water;
   immersing in the resulting solution a bismuth electrode connected to the external power source as an anode;
   immersing in the resulting solution an electrically conductive substrate connected to the external power source as a cathode; and
   applying an electric current density of below about seven amps per square foot in said anode and below about five amps per square foot in said anode current densities being maintained from about twenty-four to twenty-eight hours, whereby a total metal concentration of stannous ions and bismuth ions below about sixteen grams per liter is reached in the aqueous electroplating bath, wherein the amount by weight of bismuth ions is between about four to six times the amount by weight of stannous ions.

4. A method for preparing an aqueous electroplating bath as in claim 3 wherein said tin sulfonate salt is stannous methane sulfonate.

5. A method for plating a tin-bismuth alloy at near eutectic composition on an electrically conductive substrate, the method comprising the steps of:
   immersing the electrically conductive substrate into an aqueous electroplating bath comprised of methane sulfonic acid in an amount equal to between about one hundred thirty to two hundred grams per liter, stannous ions and bismuth ions in a total metal concentration below about sixteen grams per liter, wherein the amount by weight of bismuth ions is between about four to six times the amount by weight of stannous ions, and wetting agents in amounts sufficient to reduce gas pitting and provide continuous fine grained deposits;
   connecting the electrically conductive substrate as a cathode in said aqueous electroplating bath; and
   applying electric current to the electrically conductive substrate until such time that said electrically conductive substrate is electroplated with tin-bismuth alloy.

6. A method as in claim 5 wherein said stannous ions in said aqueous electroplating bath are present in an amount equal to between about one and eight-tenths to two and four-tenths grams per liter and said bismuth ions in said aqueous electroplating bath are present in an amount equal to between about seven to fourteen grams per liter as bismuth.

7. A method as in claim 5 wherein said electric current applied to the electrically conductive substrate is equal to a current density of about four to eight amps per square foot, said current density being maintained until the desired tin-bismuth alloy plating thickness is attained.

8. A method as in claim 5, further comprising the steps of:
   immersing at least one tin electrode in the aqueous electroplating bath;
   immersing at least one electrically conductive counter electrode in the aqueous electroplating bath which is electrically connected to said one tin electrode, whereby the electrochemical difference between tin and bismuth causes stannous ions from said one tin electrode to be oxidized into the bismuth enriched aqueous solution and bismuth ions from the bismuth enriched aqueous solution to be plated substantially onto said one counter electrode.

9. A method as in claim 8 further including the step of circulating the bismuth enriched aqueous solution.

10. A method as in claim 8 wherein said one counter electrode is comprised of stainless steel.

11. A method as in claim 5 for plating a tin-bismuth alloy at near eutectic composition on an electrically conductive substrate having parallel planar surfaces with at least one hole drilled between the parallel surfaces, the method further comprising the steps of:
    agitating the conductive substrate in a direction normal to the direction of the at least one hole; and
    sparging said aqueous electroplating bath by introducing an inert gas into said aqueous electroplating bath beneath the electrically conductive substrate, whereby said sparging removes air bubbles from the parallel planar surfaces and provides an even deposition of the tin-bismuth alloy on the parallel planar surfaces.

12. The method as in claim 11 wherein said inert gas is nitrogen.

* * * * *